United States Patent [19]

Rokos

[11] Patent Number: 4,757,270
[45] Date of Patent: Jul. 12, 1988

[54] HIGH GAIN FEEDBACK AMPLIFIER

[75] Inventor: George H. S. Rokos, Bishop's Stortford, Great Britain

[73] Assignee: STC PLC, London, England

[21] Appl. No.: 921,217

[22] Filed: Oct. 20, 1986

[30] Foreign Application Priority Data

Oct. 24, 1985 [GB] United Kingdom ............... 8526222

[51] Int. Cl.$^4$ ............................................ H03F 1/36
[52] U.S. Cl. .................................. 330/103; 330/291
[58] Field of Search ............... 330/103, 151, 259, 291, 330/293, 104

[56] References Cited

U.S. PATENT DOCUMENTS 4,028,634  6/1977  Tentarelli ........................... 330/151

FOREIGN PATENT DOCUMENTS 1584941  1/1978  United Kingdom .
2080066  7/1981  United Kingdom .

OTHER PUBLICATIONS

Geiger, R. & Budak, A. "Design of Active Filters Independent of First and Second Order Operational Time Constant Effects", IEE Trans 1981, CAS-28, pp. 749-759.

Lopes, P. B. & Bhattacharyya, B. B., "Classification, Generation and Evaluation of Actively Compensated Noninverting Finite Gain Amplifiers", IEEE J Electronic Circ. and Syst., 1984, 5, pp. 177-189.

Dobkin, R. C., in Linear Applications Handbook, National Semiconductor Corporation, 1980, LB2, 14, 18.

Wilson, G., "Compensation of Some OA based RC Active Networks", IEEE Trans, 1976, CAS-23, pp. 443-446.

Natarajan, S. & Bhattacharyya, B. B., "Design of Actively Compensated Finite Gain Amplifiers for High Frequency Applications", IEEE Trans, 1980, CAS-27, pp. 113-119.

Primary Examiner—Gene Wan
Attorney, Agent, or Firm—Lee & Smith

[57] ABSTRACT

Feedforward of the source signal into the compensation mode of an operational amplifier produces more than an order of magnitude improvement in small-signal capability at high frequencies. The technique is useful for active filters and wideband amplifiers. Further improvement will be available using amplifiers designed for this approach.

15 Claims, 5 Drawing Sheets

Fig. 1. ACCURACY ENHANCED INVERTERS
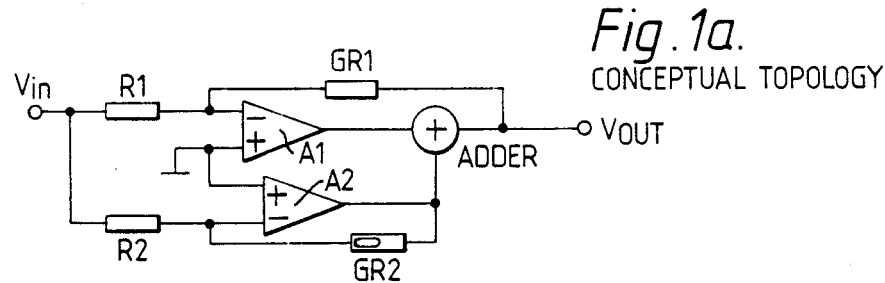
Fig. 1a. CONCEPTUAL TOPOLOGY
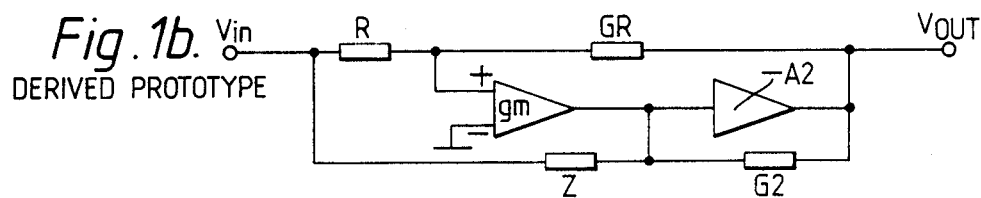
Fig. 1b. DERIVED PROTOTYPE
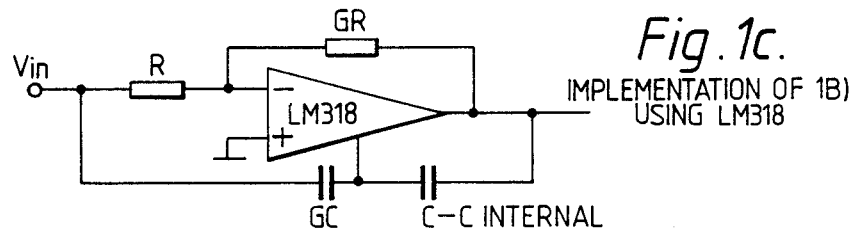
Fig. 1c. IMPLEMENTATION OF 1B) USING LM318
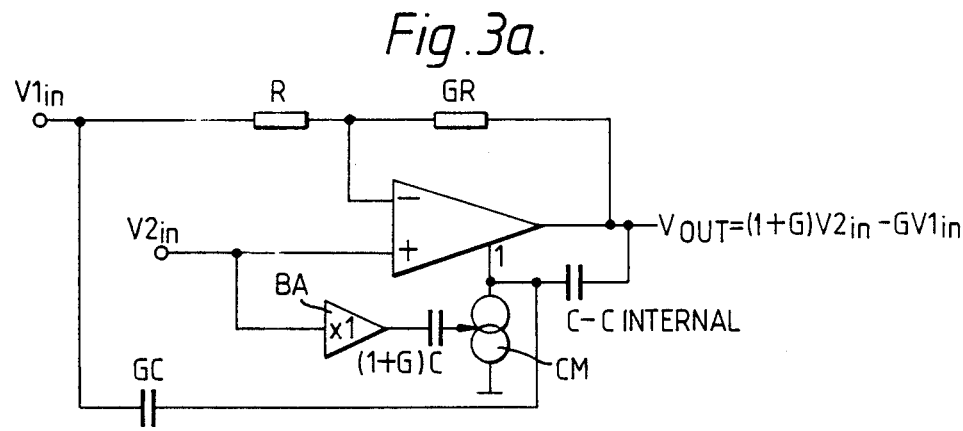
Fig. 3a.

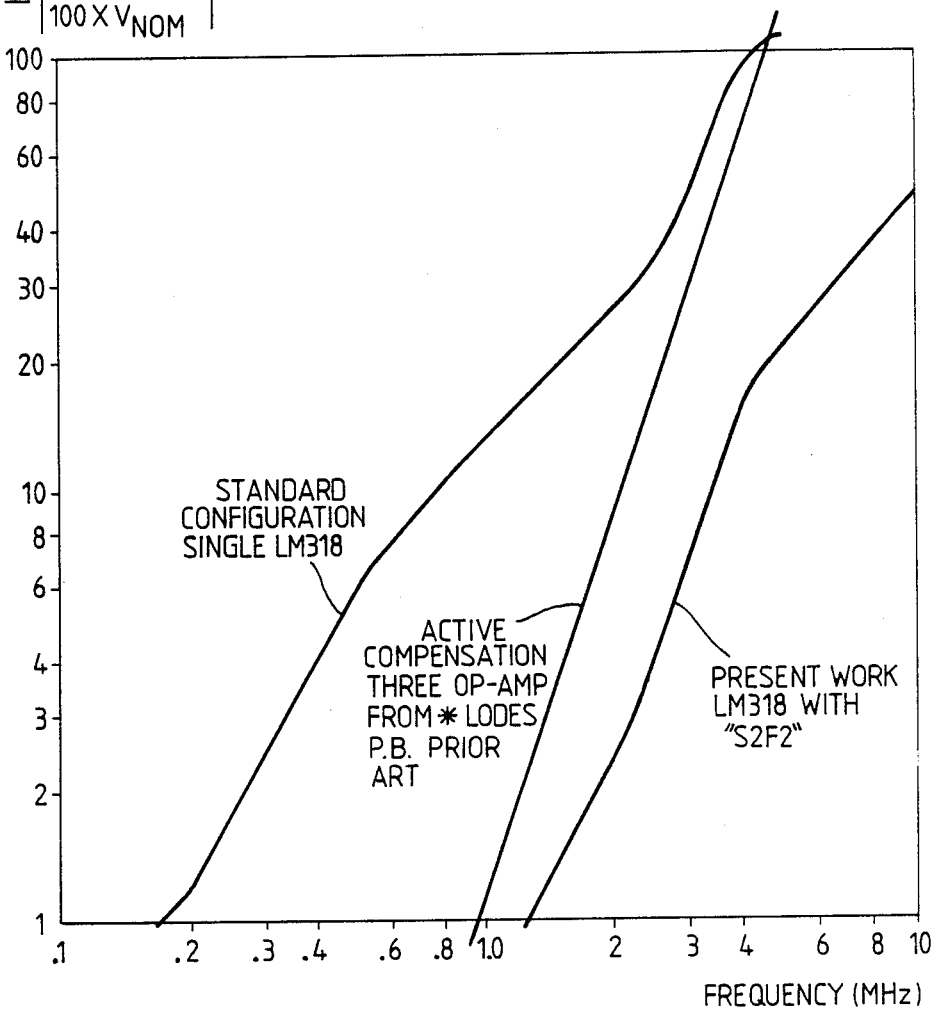
Fig. 2. COMPARATIVE RESULTS
*RESULTS OF LODES SCALED TO BE EQUIVALENT TO 15MHz UNITY GAIN CUT-OFF.

$$C_- = \frac{C_F S}{R}$$

$$C_+ = \frac{C_F (R+S)}{R}$$

APPLICATION EXAMPLE: DIFFERENTIAL

HIGH GAIN FEEDBACK AMPLIFIER

This invention relates to high gain feedback amplifiers referred to herein for clarity as finite gain amplifiers.

BACKGROUND TO THE INVENTION

Finite gain amplifiers using operational amplifiers (OA) as basic active elements are used in a wide variety of applications, such as RC active filters, oscillators and instrumentation systems.

PRIOR ART

Various techniques have been proposed for improving performance. DOBKIN R.C. in Linear Application Handbook, National Semiconductor Corporation 1980. LB2, 14, 18. WILSON G. "Compensation of some OA based RC active networks", *IEEE Trans* 1976, CAS-23 pp 443-6. NATARAJAN S. & BHATTACHARYYA B. B. "Design of actively compensated finite gain amplifiers for high frequency applications", *IEEE Trans* 1980. CAS-27 pp 113-9. GEIGER R. & BUDAK A. "Design of active filters independent of first and second order operational time constant effects", *IEE Trans* 1981, CAS-28 pp 749-59. LOPES P. B. & BHATTACHARYYA B. B. "Classification, generation and evaluation of actively compensated non inverting finite gain amplifiers", *IEEE J. Electronic* Cir. and System 1984-5 pp. 177-89. All have limited capability above a few percent of the OA cut-off frequency. In Dobkin R. C. feedforward of the signals appearing at the OA inputs raises the effective amplifier cut-off frequency and increases linear signal amplitude capability. Passive compensation in Wilson G. improves small signal accuracy significantly, but requires extensive tailoring to the individual amplifier, and cannot increase the linear signal range. Active compensation techniques proposed by Natarajan, S., Geiger R. and Lopes P. B. which provide significant improvements in small signal accuracy at frequencies removed from cut-off, reduce the linear signal range at high frequency.

UK patent No. 1584941 describes an output signal correcting circuit which has a feedback path with an adjustable resistor to preset the circuit such that when the output signal is least distorted relative to the input signal, the correcting circuit has no effect on the output signal, but will correct a distorted signal noise. This circuit has the disadvantage that the performance improvements are achieved by adjustment of gains, rather than by providing an absolute (or fundamentally based) setting, and that the response is restricted to A.C.

OBJECT OF THE INVENTION

The present invention presents a feedforward technique which extends the useful frequency range for high precision applications well beyond that previously reported for circuits of similar complexity manufactured in like technologies.

SUMMARY OF THE INVENTION

According to the present invention there is provided an amplifier circuit arrangement incorporating two feedback loops, these feedback loops containing a common gain section or sections, the feedback in these two loops being arranged so that the closed loop gain of the amplifier will remain at substantially the design value over a significant portion of the operating frequency range in the event that the feedback in either one of these loops is ineffective.

Preferably the amplifier is an operational amplifier. The amplifier can conveniently be arranged to function as an invertor or inverting integrator. The secondary feedback is applied using a form of the technique known as feedforward compensation.

Providing this appropriate feedfoward signal to the output stage of an operational amplifier reduces transfer errors by at least a factor of ten. The feedforward signal is applied in a manner which would give approximately the output required even if the standard operational amplifier inputs were held stationary. In practice, the operational amplifier has its normal feedback circuits connected, resulting in a large improvement in accuracy. The feedforward is provided via the compensation feedback network used in traditional operational amplifier designs. Applications such as accurate amplifiers and integrators, and active filters, are envisaged.

BRIEF DESCRIPTION OF THE DRAWINGS

In the drawings:

FIG. 1a shows a conceptual arrangement of a topology according to prior art;

FIG. 1b shows schematically a circuit arrangement embodying the present invention and derivable mathematically from the topology of FIG. 1A; it may be observed that the outer loop in this circuit has the benefit of using the gain of all amplifier sections.

FIG. 1c shows a practical implementation of FIG. 1b using a currently-available integrated circuit.

FIG. 2 illustrates the performance advantage of FIG. 1c; as compared with previously published work.

FIG. 3a shows another embodiment of the invention;

FIG. 3b shows a specific embodiment of FIG. 3a;

FIG. 6b shows a differential amplifier application of FIG. 6a.

DESCRIPTION OF THE PREFERRED EMBODIMENT

Figure 3B:
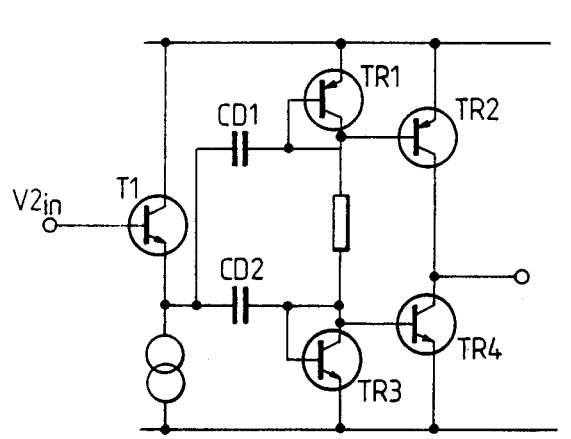

A conceptual arrangement for an accuracy enhanced inverter of nominal gain G is shown in FIG. 1a. The circuit arrangement comprises an input signal terminal $V_{in}$ connected to two impedances R1 and R2 and feeding the inverting inputs (minus) of respective operational amplifiers A1 and A2. The function of R2 is generally identified using the term feedforward. The non-inverting inputs (plus) are connected in common and to a reference voltage such as earth.

The operational amplifiers A1 and A2 feed an ADDER circuit from which the output signal $V_{out}$ is derived at output terminal $V_{out}$. Feedback resistance GR1, which is R1 multiplied by the desired gain G, between the inverting input (minus) of amplifier A1 and the output terminal $V_{out}$, and feedback impedance GR2 is resistance R2 multiplied by the desired gain G of amplifier A2, and this is represented between inverting input (minus) of amplifier A2 and the output of that amplifier.

Amplifier A2 is connected as a fixed gain inverter which in practice will have some error. Amplifier A1 is also connected as a fixed gain amplifier, but the output of amplifier A1 is added to the already substantially correct output of amplifier A2; amplifier A1 also gives an output which is substantially correct even in the absence of the input signal $V_{in}$ being applied to R2. Amplifier A1 is in a feedforward arrangement (the feedforward signal being provided by amplifier A2) so that any error is corrected by the action of amplifier A1.

The gain of this inverter is $$V_{OUT}/V_{IN} = -G(1-(1+G)^2/((A1+1+G)(A2+1+G)).$$

where A1 and A2 represent the amplification factors of amplifiers A1 and A2.

This represents a significant reduction in the error term compared with a single operational amplifier implementation. It would, however, require the use of a near-ideal adder ADDER.

The derived circuit of FIG. 1b is mathematically equivalent, with $(A2gmZ-(1+G)^2/(1+G+A2)$ substituted for A1 where gm is a transconductance amplifier, Z is an impedance, GZ is the impedance multiplied by the desired gain G, R is a (typically resistive) impedance, and GR is an impedance resistance having a value of R multiplied by the desired gain G which may be real or complex. The amplifier section A2 is common to two feedback loops, there being a feedback loop around A2 (commonly known as feedforward) employing Z and GZ, and a loop around the component amplifier, employing R and GR. Moreover, the internal configuration of a feedback-compensated operational amplifier such as the National Semiconductor Corporation LM318 or the UA709 is very similar to the active section of this circuit. A LM318 comprises an operational amplifier having several sections, grouped as shown into two particular sections, and FIG. 1c shows an LM318 connected in the manner of the schematic drawing of FIG. 1b.

The circuit shown in FIG. 1c (LM318) incorporates source signal feedforward which for convenience will hereinafter be referred to as S2F2. It is worth noting at this stage that the second amplifier (A2) within the operational amplifier LM318 usually has a gain-bandwidth many times that of the complete operational amplifier.

We might reasonably expect, therefore, that this two-section amplifier will out-perform the apparently superior three-operational amplifier schemes outlined by Natarajan, Geiger and Lopes for frequencies moderately close to the operational amplifier unity gain cutoff.

Experimental Results

A unity gain inverter was constructed using an LM318 operational amplifier and the particular one used was that made by National Semiconductors Corporation. It was connected as shown in FIG. 1c. Both resistors were 1k5, and the feedforward capacitance (GC) was 7.8 pF. The external feedback capacitor (C) was reduced from the theoretical 7.8 pF to 3.8 pF to allow for the effects of internal compensation components. The small signal error for this "S2F2" amplifier is shown in FIG. 2. Results for a standard inverter and for circuit type C1 of the Lopes prior art are shown for comparison. (The validity of comparison with Lopes is justified in the discussion section).

It can be seen that the accuracy improvement exceeds an order of magnitude for frequencies below 2 MHz, and that the three-OA circuit can be expected to have advantages only when the error has already fallen below 0.2%.

The linear range was determined by observing signal distortion at the inverting input of the operational amplifier. For the standard configuration, distortion became visible whenever the output slew rate exceeded 7.5 V/uSec. The "S2F2 operational amplifier" showed some frequency dependence of the distorting slew rates, but distortion was not observed below 30V/uS.

The absolute limit on slew rate was increased for negative slews, but remained unchanged at 120V/uS for positive slews.

Discussion

It has been shown that an "S2F2" technique for accuracy enhancement gives excellent results for inverting amplifiers. Loop stability should present few problems as the criteria are identical to those for the standard operational amplifier. Inverting integrators have been built using the same configuration with similar results. The phase response allows further active compensation to be applied round the S2F2 amplifier if desired, which would render it superior to other known schemes at all frequencies.

There are, however, many applications where non-inverting gains are also required, and operational amplifiers like the LM318 do not contain the active components necessary for this to be done. An appropriate scheme is shown in FIG. 3 which represents conceptually my inventive "S2F2" scheme with positive/differential signal capability as applied to the LM318. The modification comprises a buffer amplifier BA with a gain of unity, a current-providing capacitor having a value (1+G)C and a current mirror CM which inverts the current that would be going to ground and feeds it to the same point as the feedforward feed in FIG. 1c. There are two inputs, $V1_{IN}$ remote from the operational amplifier inverting input (minus) and $V2_{in}$ which uses the operational amplifier terminal (plus). The accuracy of this arrangement should be virtually identical to that of the inverting amplifier, as the only effect on the amplifier loop gains is capacitative loading at the compensation point of the operational amplifier. The actual effect of this loading will be rather small, as the operational amplifier already has an effective grounded input capacitance (presumably to ensure stability) at the compensation point of greater than 100 pF. (This value was deduced from open and closed loop measurements of the second stage). The accuracy of my "S2F2" amplifier will therefore be determined by the closed loop inverting gain. The unity gain inverting amplifier is thus equivalent to a non-inverting amplifier with a X2 gain. This justifies comparison of the results obtained above with the three operational amplifier active compensation scheme of Lopes.

A possible implementation of the buffer/mirror modification is shown in FIG. 3(b). The simplified buffer amplifier BA is shown as a single transistor, a pair of capacitors CD1, CD2 comprising the current providing capacitance (1+G)C and the four transistors TR1, TR2, TR3 and TR4 connected to act as a current mirror CM.

Figure 4A:
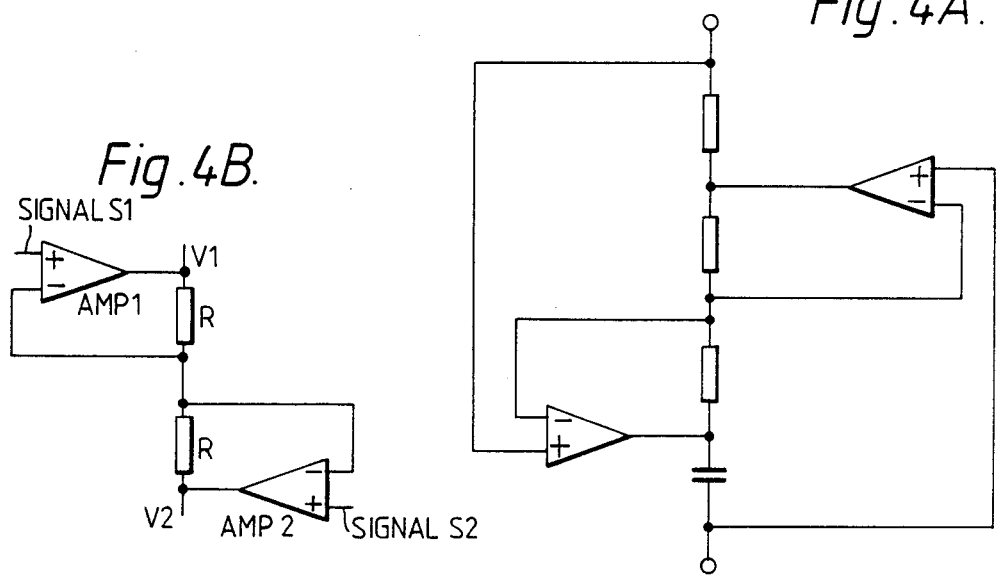
FIGS. 4a, 4b, 4c show how generalised impedance convertors can be made to embody the invention.
Figure 4B:
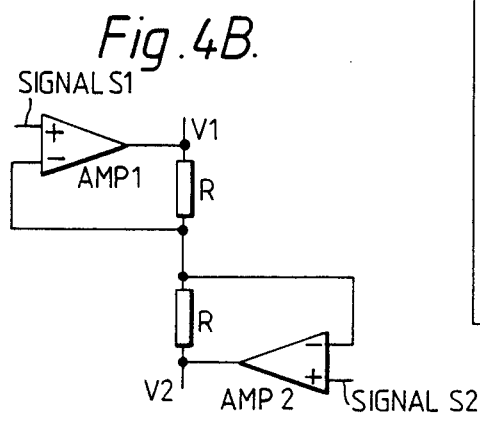
Figure 4C:
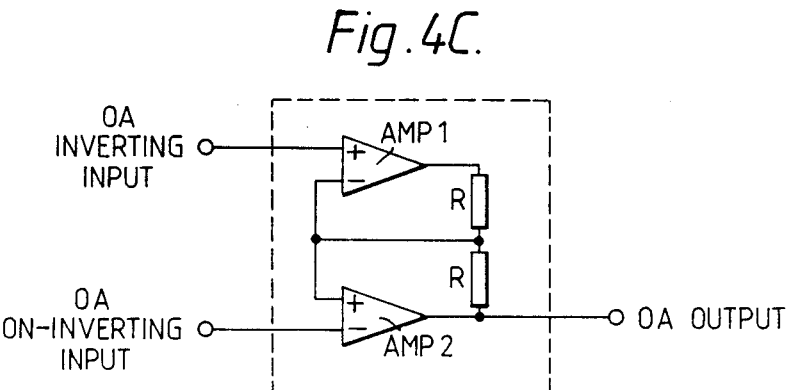

An operational amplifier implementation of particular interest to active filter designers is the generalised impedance converter (GIC) type B shown in FIG. 4a. This is described for example in the textbook entitled "Filter Theory and Design, Active and Passive" by Sedra and Brackett, ISBN 0273014293. The configuration of the control portion of such a GIC, hereafter referred to as the GIC core shown in FIG. 4b. It will be seen that, ideally, V1=2S1−V2:- that is, the GIC core is a fixed gain device. The application of fixed feedforward enhancement to pairs of amplifiers would thus produce a device with enhanced performance, and with ease of application identical to standard operational amplifier circuits at present in use. The pairs produced can also be used as a single enhanced operational amplifier when connected as in FIG. 4c, and would thus be suitable for general purpose operational amplifier applications. Thus in a configuration embodying the present invention, each operational amplifier AMP1 and AMP2 is as described with reference to FIG. 3a or FIG. 3b. This is an ideal application of the invention because it is economical, e.g. the positive inputs to each of AMP1 and AMP2 are not actually extra connections because they already exist as output connections. Thus no additional pins would be required to adopt the present invention in the GIC.

Encouraging as the results to date are, it is considered probable that even better results will be achieved using operational amplifiers which are specifically designed for source-signal-feedforward ("S2F2"). The reasons for this are twofold: first, the disposition of gains and compensation within the standard oprational amplifier is in no way geared to the use of controlled feedforward: second it will be permissable to reduce the low frequency gain of the overall operational amplifier by at least an order of magnitude when the feedforward response extends to D.C. The magnitude of the available bandwidth extension has not yet been determined, but it is clear that the linear slew rate capability can be increased by at least a factor of five.

Figure 5A:
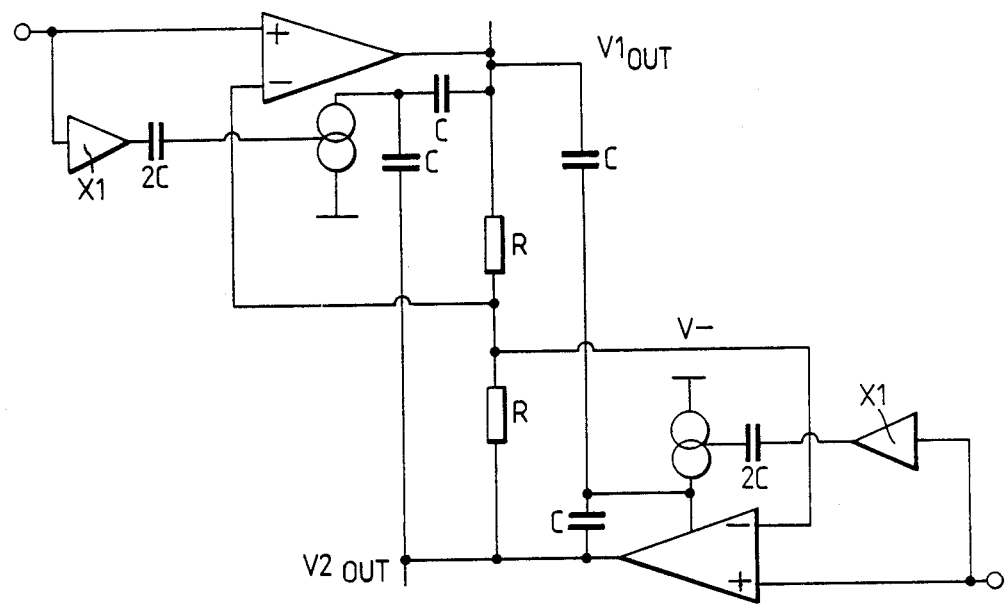
FIG. 5a shows details of a feedforward arrangement embodying the invention for use in a generalised impedance convertor (GIC)

Referring to FIG. 5a, this shows the arrangement of FIG. 3a applied to the GIC of FIG. 4a showing in particular the pole compensation capacitors C that are required for an operational amplifier and which will all be internal capacitance of the integrated circuit such as once again the LM318. The resistors R can be internal or external, although probably they will be external so that they can be matched, in particular for tuning the responses of active filters.

Figure 5B:
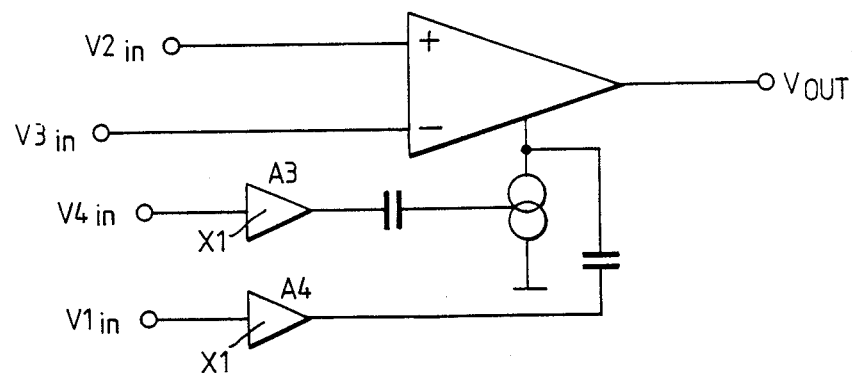
FIG. 5b shows an equivalent version of FIG. 5a in which the amplifier may also be used independently.

FIG. 5b shows a possible equivalent of FIG. 5a allowing independent use of operational amplifiers as in differential amplifiers, inverters, etcetera. Only a single operational amplifier is actually shown. Thus FIG. 5b shows how the principle of the invention can be applied to a straightfoward operational amplifier making it as easy as possible to connect "to the outside world". The amplifiers A3 and A4 are "simple" amplifiers and the three inputs V1$_{in}$, V2$_{in}$, V3$_{in}$ and V4$_{in}$ correspond with the inputs as designated in the earlier Figures.

Figure 6A:
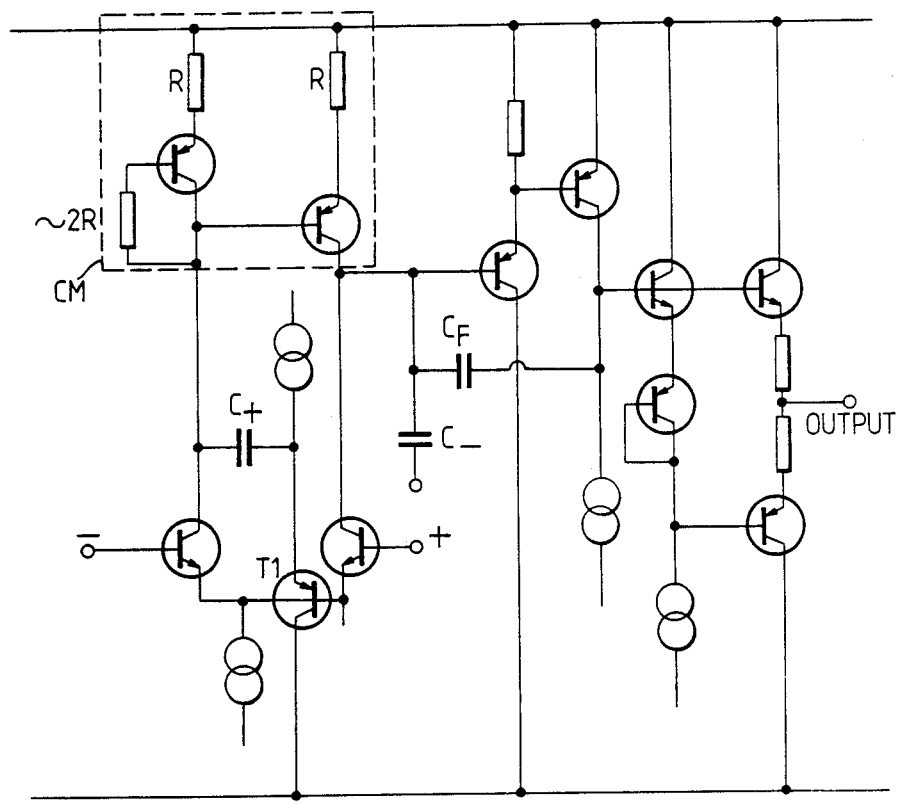
FIG. 6a shows an amplifier designed to include source signal feedforward according to an embodiment of the invention.
Figure 6B:
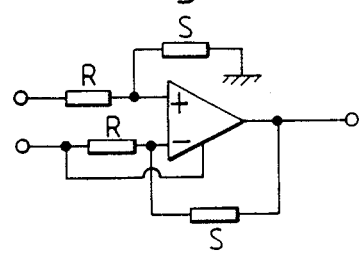

Referring to FIG. 6a this shows a standard operational amplifier configuration modified to embody the invention to provide a simple unprotected discrete operational amplifier with feedforward on the chip. The additional components are transistor T1 and the associated current source CS, and the additional capacitors C+C−. FIG. 6b shows one application of FIG. 6a as a differential amplifier.

The current mirror is referenced CM and uses the existing internal current mirror as the feedfoward mirror. The transistor T1 acts as the buffer amplifier, the capacitor $C_F$ supplies the existing pole for operational amplifier frequency compensation and C− provides the negative input feedforward. The capacitor C+ provides the positive signal feedforward. This arrangement for C+ will not necessarily be suitable for all designs and, further, large input signals can result in "slew rate limit" effects even when the output should be stationary.

The circuit design shown is very similar to the existing LM324 except that all the transistors are of the opposite polarity, but otherwise the operating principles are the same, except of course for the modifications described above in accordance with an embodiment of the present invention.

Conclusion

A feedforward technique has been proposed and shown to enhance the high frequency accuracy of OA's beyond previously published levels. The technique has no adverse effect on loop stability and large signal performance is improved. So far as the author can ascertain, the technique has not previously been reported.

A general purpose device suitable for integration, and particularly suitable for active filter requirements has been proposed. Such a component should extend the applicability of OA based active filters into the few MHz range.

It is to be understood that the invention is applicable not only to amplifiers based on operational amplifiers but also to inverters, and inverting integrators and similar devices.

I claim:

1. An amplifier circuit arrangement having an input and an output and incorporating first and second feedback loops and first and second gain sections each having an input and an output, the output of the first gain section being coupled to the input of the second gain section to form a composite amplifier, the first feedback loop being around the second gain section and connected to an input of the second gain section, and second feedback loop being around the composite amplifier and coupled between the input and output of the circuit arrangement, the feedback in the first and second loops being arranged so that the closed loop gain of the arrangement will remain at substantially the design value over a significant portion of the operating frequency range in the event that the feedback in either one of the loops is ineffective.

2. An arrangement according to claim 1 in which at least one of the feedback loop responses extends to D.C.

3. An arrangement according to claim 1 in which the external response of the amplifier circuit arrangement extends to D.C.

4. An arrangement according to any of claim 1 to 3 comprising several said second gain sections in one of the loops, all said second gain sections being contained within the first loop.

5. An arrangement according to any one of claims 1 to 3 wherein the input to at least one of the feedback loops is driven by the output of a fixed gain amplifier.

6. An arrangement according to claim 1, wherein the arrangement includes a multi-stage amplifier and at least one of the loops is taken round the multistage amplifier with a dominant pole provided by an amplification section of the multistage amplifier.

7. An amplifier according to claim 6 in which the second loop is implemented around said amplification section.

8. An amplifier according to claim 7 in which a feedback component of the second loop is a capacitor which also serves to define said dominant pole.

9. An amplifier according to claim 1 wherein at least one of the feedback loops is taken around an operational amplifier.

10. An amplifier according to claim 6, wherein the multistage amplifier is an operational amplifier.

11. An amplifier according to claim 6, wherein the multistage amplifier is an invertor.

12. An arrangement according to claim 1, constructed as an inverting amplifier.

13. An arrangement according to claims 1, constructed as an integrating amplifier.

14. An arrangement according to claims 1, constructed as a fixed gain amplifier.

15. An arrangement as defined in claim 1, constructed as a summing or differential amplifier.

* * * * *